US012672445B2

(12) United States Patent
Ryu

(10) Patent No.: US 12,672,445 B2
(45) Date of Patent: Jun. 30, 2026

(54) DISPLAY DEVICE INCLUDING ELASTIC PROTRUSIONS ON PAD AREA OF SUBSTRATE

(71) Applicant: SAMSUNG DISPLAY CO., LTD., Yongin-si (KR)

(72) Inventor: Seung-Soo Ryu, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 470 days.

(21) Appl. No.: 18/322,959

(22) Filed: May 24, 2023

(65) Prior Publication Data

US 2024/0081112 A1 Mar. 7, 2024

(30) Foreign Application Priority Data

Sep. 7, 2022 (KR) ........................ 10-2022-0113832

(51) Int. Cl.
*H10K 59/131* (2023.01)

(52) U.S. Cl.
CPC .................................. *H10K 59/131* (2023.02)

(58) Field of Classification Search
CPC .................................................... H10K 59/131
See application file for complete search history.

(56) References Cited

U.S. PATENT DOCUMENTS

| | | | |
|---|---|---|---|
| 8,097,817 B2 | 1/2012 | Hashimoto | |
| 10,510,821 B2* | 12/2019 | Jo | ........................ H10K 59/131 |
| 2005/0098901 A1 | 5/2005 | Chang et al. | |

| | | | |
|---|---|---|---|
| 2006/0146214 A1* | 7/2006 | Hwang | ............... G02F 1/13458 |
| | | | 257/E27.112 |
| 2008/0237850 A1* | 10/2008 | Chang | .................... H10W 72/20 |
| | | | 257/737 |
| 2009/0039495 A1 | 2/2009 | Yamashita et al. | |
| 2013/0335940 A1 | 12/2013 | Matsui et al. | |
| 2017/0358642 A1* | 12/2017 | Jo | ........................... H01L 25/18 |
| 2019/0348487 A1 | 11/2019 | Kim et al. | |
| 2022/0059640 A1 | 2/2022 | Park et al. | |

FOREIGN PATENT DOCUMENTS

| | | |
|---|---|---|
| JP | 4548459 | 7/2010 |
| KR | 10-2013-0013515 | 2/2013 |
| KR | 10-2019-0021625 | 3/2019 |
| KR | 10-2019-0130091 | 11/2019 |
| KR | 10-2022-0023893 A | 3/2022 |

OTHER PUBLICATIONS

Extended European Search Report issued in connection with corresponding EP Application No. 23191240.3 dated Feb. 13, 2024.

* cited by examiner

*Primary Examiner* — Lex H Malsawma
(74) *Attorney, Agent, or Firm* — F. CHAU & ASSOCIATES, LLC

(57) ABSTRACT

A display device includes a substrate including a display area and a pad area. A plurality of pad electrodes is disposed in the pad area on the substrate. A plurality of elastic protrusions including a plurality of first elastic protrusions is disposed on each of the pad electrodes and a plurality of second elastic protrusions is disposed between the pad electrodes on substrate, in a plan view. A conductive layer is disposed on each of the first elastic protrusions. A driving chip overlaps the pad area and includes a base portion facing the substrate and a plurality of bump electrodes attached to one surface of the base portion and overlapping the pad electrodes, respectively.

25 Claims, 14 Drawing Sheets

SUB

PD  EP1  EP2

II  II'

DR2
⊗—→DR1

$IC\begin{cases} BE \\ BS \end{cases}$  $EP\begin{cases} EP1 \\ EP2 \end{cases}$

W2

EP1  BE  EP2

BS

CL

SUB

W1  d  W1  d

DR2
⊗—→DR1

$IC\begin{cases} BE \\ BS \end{cases}$  $EP\begin{cases} EP1 \\ EP2 \end{cases}$ IC $\begin{cases} BE \\ BS \end{cases}$   EP $\begin{cases} EP1 \\ EP2 \end{cases}$

DR2
⊗ → DR1

IC $\begin{cases} BE \\ BS \end{cases}$   EP $\begin{cases} EP1 \\ EP2 \end{cases}$

DR2
⊗ → DR1

DISPLAY DEVICE INCLUDING ELASTIC PROTRUSIONS ON PAD AREA OF SUBSTRATE

CROSS-REFERENCE TO RELATED APPLICATION

This application claims priority to Korean Patent Application No. 10-2022-0113832, filed in the Korean Intellectual Property Office on Sep. 7, 2022, which is hereby incorporated by reference in its entirety.

TECHNICAL FIELD

Embodiments provide generally to a display device. More particularly, embodiments provide a display device including elastic protrusions on a pad area of a substrate thereof.

DISCUSSION OF THE RELATED ART

Display devises are a widely used element of modern information devices. Accordingly, the use of display devices, such as a liquid crystal display (LCD) device, an organic light emitting diode (OLED) display device, a plasma display device, and the like is increasing.

A display device generally includes a display panel displaying an image and a control circuit driving the display panel. For example, the control circuit includes a driving chip, a printed circuit board ("PCB"), and the like, and most of the driving chip and the printed circuit board are mounted on an edge of the display panel. For example, the driving chip may be directly mounted on the display panel through an anisotropic conductive film ("ACF"), or may be mounted on a tape carrier package ("TCP") or a flexible film and electrically connected to the display panel through an anisotropic conductive film.

SUMMARY

A display device includes a substrate including a display area and a pad area. A plurality of pad electrodes is disposed in the pad area on the substrate. A plurality of elastic protrusions includes a plurality of first elastic protrusions disposed on each of the pad electrodes and a plurality of second elastic protrusions disposed between the pad electrodes. A conductive layer is disposed on each of the first elastic protrusions. A driving chip overlaps the pad area and includes a base portion facing the substrate and a plurality of bump electrodes attached to one surface of the base portion and overlapping the pad electrodes.

Each of the elastic protrusions may include an organic polymer material.

Each of the elastic protrusions may have a cross-sectional shape that is rectangular, rounded, semielliptical, triangular, or rectangular shape with rounded corners.

An upper surface of the conductive layer may be positioned at a same level as an upper surface of each of the second elastic protrusions.

The pad electrodes and the bump electrodes may be repeatedly arranged along a first direction, and each of the pad electrodes and each of the bump electrodes may extend in a second direction crossing the first direction.

A width of each of the first elastic protrusions may be equal to a width of each of the second elastic protrusions.

The first elastic protrusions and the second elastic protrusions may be spaced apart from each other at equal distance along the first direction.

A width of each of the bump electrodes may be N times a sum of the width of each of the elastic protrusions and a distance between two elastic protrusions adjacent in the first direction among the elastic protrusions (where, N is a positive integer).

A number of the first elastic protrusions disposed on one pad electrodes among the pad electrodes may be equal to a number of the second elastic protrusions disposed between two pad electrodes adjacent in the first direction among the pad electrodes.

A number of the first elastic protrusions disposed on one pad electrodes among the pad electrodes may be different from a number of the second elastic protrusions disposed between two pad electrodes adjacent in the first direction among the pad electrodes.

The first elastic protrusions may overlap a central portion of each of the pad electrodes, and the second elastic protrusions may overlap a central portion between two adjacent pad electrodes among the pad electrodes.

The first elastic protrusions may be disposed in a first zigzag pattern and the second elastic protrusions may be disposed in a second zigzag pattern.

The display device may further include a transistor including an active pattern, a gate electrode, a source electrode, and a drain electrode sequentially disposed in the display area on the substrate. The conductive layer may include a same material as the source electrode and the drain electrode.

The display device may further include an adhesive layer disposed between the substrate and the driving chip, and covering the pad electrode and the bump electrodes.

The adhesive layer may include an insulating polymer material.

An upper surface of the conductive layer may contact the bump electrodes.

An upper surface of the conductive layer may contact the bump electrodes and an upper surface of each of the second elastic protrusions may at least partially contact each of the bump electrodes.

A display device includes a substrate including a display area and a pad area. A plurality of pad electrodes is disposed in the pad area on the substrate. A driving chip overlaps the pad area and includes a base portion facing the substrate and a plurality of bump electrodes attached to one surface of the base portion and overlapping the pad electrodes. A plurality of elastic protrusions is disposed in the pad area on the substrate. At least one of the elastic protrusions overlaps the bump electrodes. A sum of widths of portions of the elastic protrusions overlapping one bump electrode among the bump electrodes may be N times a width of each of the elastic protrusions (where, N is a positive integer).

Each of the elastic protrusions may include an organic polymer material.

Each of the elastic protrusions may have a cross-sectional shape that is rectangular, rounded, semicircular, semielliptical, triangular, or a rectangular shape with rounded corners.

The elastic protrusions may include a plurality of first elastic protrusions disposed on each of the pad electrodes and a plurality of second elastic protrusions disposed between the pad electrodes on the substrate.

The display device may further include a conductive layer disposed on each of the first elastic protrusions.

The pad electrodes and the bump electrodes may be repeatedly arranged along a first direction, and each of the pad electrodes and each of the bump electrodes may extend in a second direction crossing the first direction.

A width of each of the first elastic protrusions may be equal to a width of each of the second elastic protrusions.

The first elastic protrusions and the second elastic protrusions may be spaced apart from each other at equal distance along the first direction.

A width of each of the bump electrodes may be N times a sum of the width of each of the elastic protrusions and a distance between two elastic protrusions adjacent in the first direction among the elastic protrusions (where, N is a positive integer).

A display device includes a plurality of pad electrodes disposed in a pad area on a substrate. A plurality of first elastic protrusions is disposed on each of the pad electrodes. A plurality of second elastic protrusions is disposed between the pad electrodes on the substrate. The display device further includes a driving chip. The driving chip includes a base portion facing the substrate and a plurality of bump electrodes attached to a lower surface of the base portion. A width of each of the bump electrodes may be N times the sum of a width of each elastic protrusion and a distance between two adjacent elastic protrusions (where N is a positive integer).

Accordingly, a short defect or an open defect of the display device occurring in the process of bonding the driving chip to the substrate may be reduced in frequency and/or severity.

BRIEF DESCRIPTION OF THE DRAWINGS

Illustrative embodiments of the present disclosure will be more clearly understood from the following detailed description in conjunction with the accompanying drawings.

FIG. 2 is a cross-sectional view taken along line I-I' of FIG. 1.

DETAILED DESCRIPTION OF THE EMBODIMENTS

Figure 1:
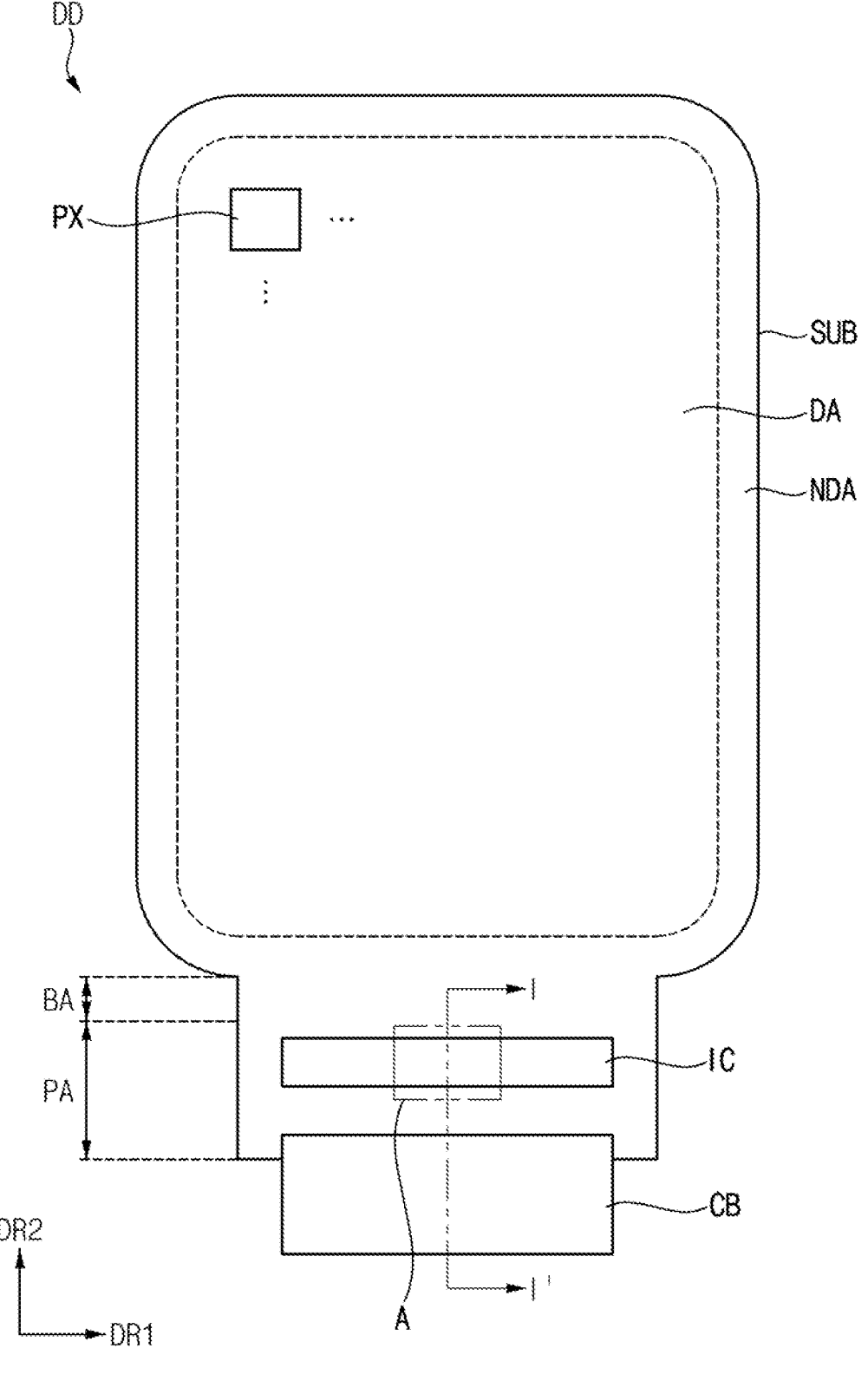
FIG. 1 is a plan view illustrating a display device according to an embodiment.

Hereinafter, a display device according to embodiments of the present disclosure will be explained in detail with reference to the accompanying drawings. The same reference numerals may be used for the same components in the specification and drawings, and to the extent that an element is not described in detail with respect to one drawing, it may be understood that such elements are at least similar to corresponding elements that are described in detail with respect to another drawings.

Figure 2:
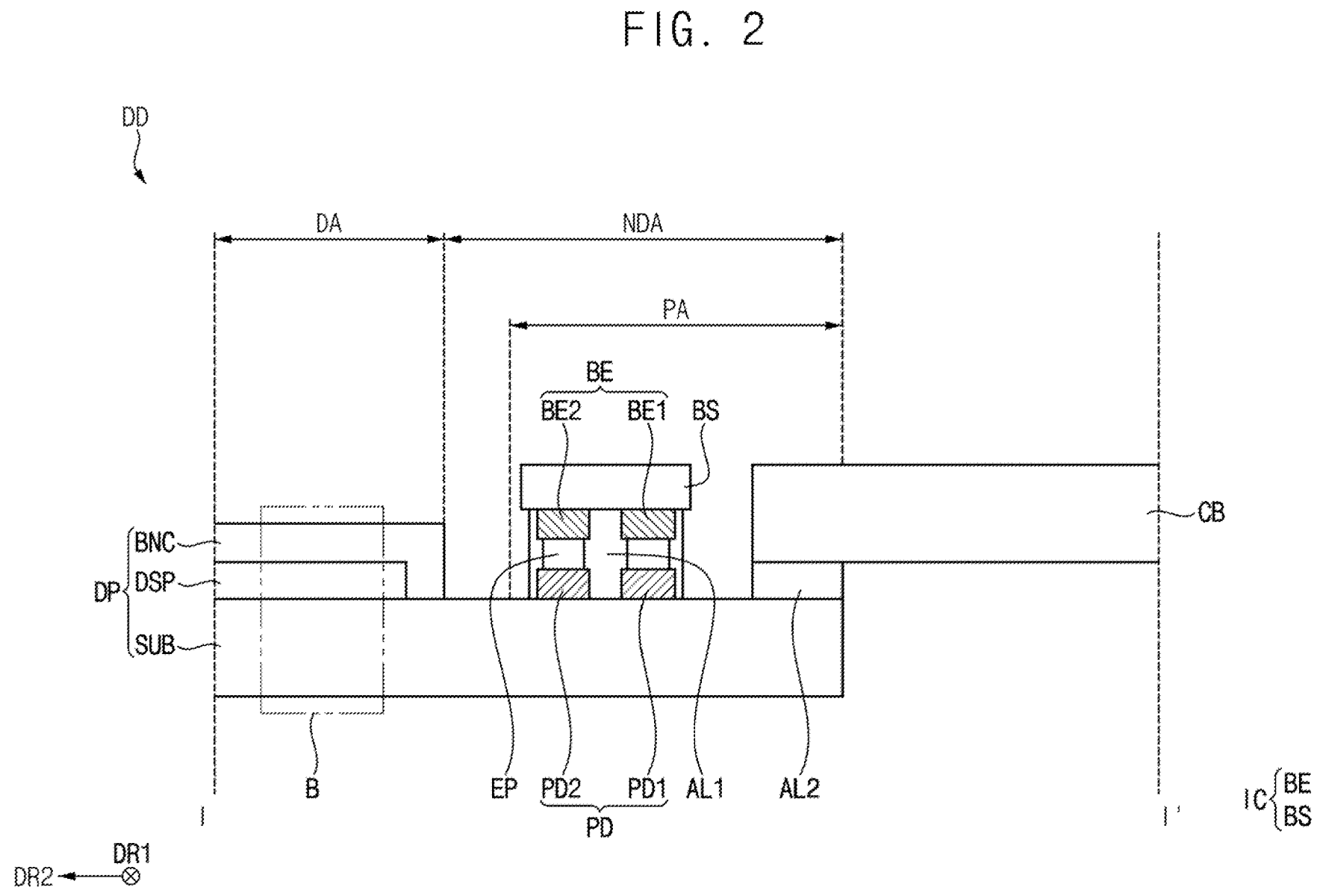
Figure 3:
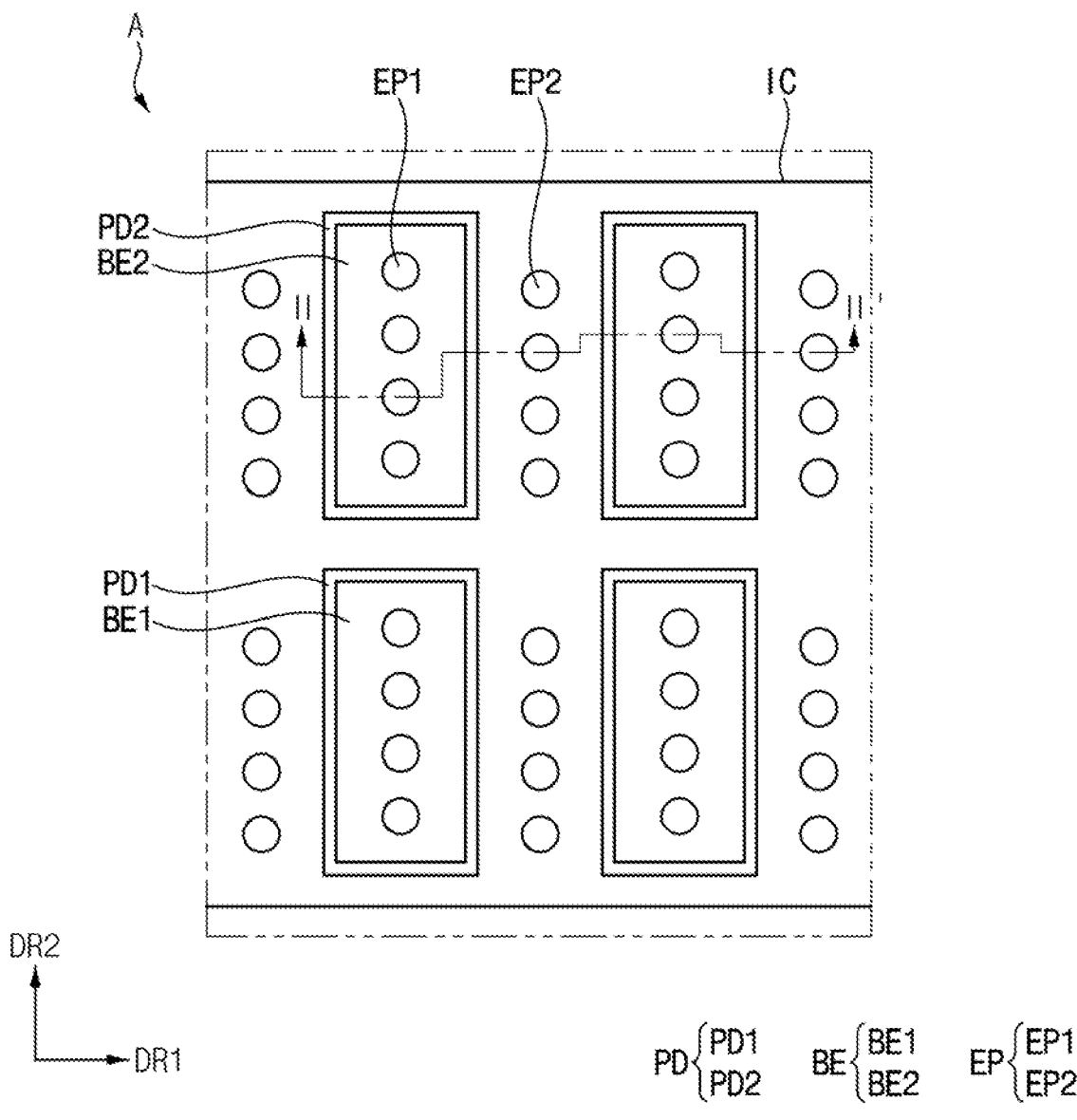
FIG. 3 is an enlarged plan view of an example of area A of FIG. 1.

FIG. 1 is a plan view illustrating a display device according to an embodiment. FIG. 2 is a cross-sectional view taken along line I-I' of FIG. 1. FIG. 3 is an enlarged plan view of an example of area A of FIG. 1.

Referring to FIGS. 1, 2, and 3, a display device DD, according to an embodiment of the present disclosure, may include a display panel DP, a plurality of pad electrodes PD, a driving chip IC, a plurality of elastic protrusions BP, a circuit board CB, a first adhesive layer AL1, and a second adhesive layer AL2.

The display panel DP includes a substrate SUB, a display portion DSP disposed in the display area DA on the substrate SUB, and an encapsulation layer ENC disposed on the display portion DSP and at least partially surrounding the display portion DSP. A detailed description of components of the display panel DP will be described later.

The substrate SUB may include a display area DA and a non-display area NDA. The non-display area NDA may be proximate to the display area DA. For example, the non-display area NDA may surround at least a portion of the display area DA. The display area DA may be an area capable of displaying an image by generating light or adjusting transmittance of light provided from an external light source. The non-display area NDA may be an area not displaying an image.

A plurality of pixels PX may be arranged in the display area DA on the substrate SUB. Each of the pixels PX may include a driving element and a light emitting element electrically connected to the driving element. Each of the pixels PX may generate light according to a driving signal. The pixels PX may be entirely arranged in the display area DA in a matrix form. Signal lines providing gate signals, data signals, and the like and power supply lines providing power to each of the pixels PX may be disposed in the display area DA on the substrate SUB.

Drivers may be disposed in the non-display area NDA. For example, the drivers may include a gate driver generating the gate signal and a data driver generating the data signal.

The non-display area NDA may include a bending area BA and a pad area PA. The bending area BA may be positioned between the display area DA and the pad area PA, in a plan view. A portion of the substrate SUB overlapping the bending area BA may be bent about a bending axis extending in the first direction DR1. In addition, the pad area PA may have a shape extending along one side of the display device DD. For example, the pad area PA may have a shape extending along the first direction DR1 parallel to an upper surface of the substrate SUB.

The plurality of pad electrodes PD may be disposed in the pad area PA on the substrate SUB. As shown in FIG. 3, the pad electrodes PD may be spaced apart from each other along the first direction DR1. In addition, each of the pad electrodes PD may extend in a second direction DR2 crossing the first direction DR1. Each of the pad electrodes PD may include metal, a transparent conductive material, and the like. Examples of materials that may be included in each of the pad electrodes PD may include metal such as gold ("Au"), silver ("Ag"), aluminum ("Al"), copper ("Cu"), and the like and transparent conductive material such as indium tin oxide ("ITO"), indium zinc oxide ("IZO"), indium zinc tin oxide ("IZTO"), and the like. These may be used alone or in combination with each other. However, materials that may be included in each of the pad electrodes PD are not necessarily limited thereto, and each of the pad electrodes PD may include other materials. In an embodiment, each of the pad electrodes PD may have a multilayer structure including ITO/Ag/ITO.

The pad electrodes PD may include a plurality of input pad electrodes PD1 and a plurality of output pad electrodes PD2. In a plan view, the output pad electrodes PD2 may be repeatedly arranged along the first direction DR1 in a first row, and the input pad electrodes PD1 may be repeatedly arranged along the first direction DR1 in a second row adjacent to the first row. Each of the input pad electrode PD1 and the output pad electrode PD2 may be referred to as a pad electrode.

The output pad electrodes PD2 may receive a driving signal output from the driving chip IC. For example, the driving signal output from the driving chip IC may be provided to the pixels PX through the output pad electrodes PD2.

The input pad electrodes PD1 may transmit control signal, power, and the like provided from the circuit board CB to the driving chip IC. For example, control signal and power output from the circuit board CB may be provided to the driving chip IC through the input pad electrodes PD1.

The driving chip IC may be disposed in the pad area PA on the substrate SUB. The driving chip IC may control signals and voltages provided to the pixels PX. In an embodiment, when the substrate SUB includes glass, the driving chip IC may have a chip on glass ("COG") structure directly disposed on the substrate SUB. In an embodiment, when the substrate SUB includes a transparent resin substrate, the driving chip IC may have a chip on plastic ("COP") structure directly disposed on the substrate SUB. However, the present disclosure is not necessarily limited thereto, and a flexible film is disposed in the pad area PA on the substrate SUB, and the driving chip IC may have a chip on film (COF) structure directly disposed on the flexible film.

The driving chip IC may include abase portion BS facing the substrate SUB and a plurality of bump electrodes BE attached to a lower surface of the base portion BS. As shown in FIG. 3, the bump electrodes BE may be spaced apart from each other along the first direction DR1. In addition, each of the bump electrodes BE may extend in the second direction DR2 crossing the first direction DR1. Each of the bump electrodes BE may overlap each of the pad electrodes PD. For example, each of the bump electrodes BE may include a metal such as copper, gold, and the like. These may be used alone or in combination with each other. In addition, the base part BS may include plastic such as polyimide.

The bump electrodes BE may include a plurality of input bump electrodes BE1 and a plurality of output bump electrodes BE2. In a plan view, the output bump electrodes BE2 may be repeatedly arranged along the first direction DR1 in the first row, and the input bump electrodes BE1 may be repeatedly arranged along the first direction DR1 in a second row adjacent to the first row. Each of the input bump electrode BE1 and the output bump electrode BE2 may be referred to as a bump electrode.

Each of the output bump electrodes BE2 may output the driving signal provided to the pixels PX. Each of the output bump electrodes BE2 may overlap each of the output pad electrodes PE2 to correspond to each other.

Each of the input bump electrodes BE1 may receive the control signal, the power, and the like provided from the circuit board CB. Each of the input bump electrodes BE1 may overlap each of the input pad electrodes PD1 to correspond to each other.

The plurality of elastic protrusions EP may be disposed in the pad area PA between the substrate SUB and the driving chip IC. For example, each of the elastic protrusions EP may be disposed between the pad electrode PD and the bump electrode BE. The pad electrode PD and the bump electrode BE may be electrically connected through the elastic protrusions E Through this, the elastic protrusions EP may electrically connect the display panel DP and the driving chip IC. Each of the elastic protrusions EP may include an organic polymer material. For example, each of the elastic projections EP may include an organic polymer material such as an epoxy resin, an acrylic resin, a urethane resin, a photoresist, and the like. These may be used alone or in combination with each other. A detailed description of the elastic protrusions EP will be described later.

The first adhesive layer AL1 may be disposed in the pad area PA between the substrate SUB and the driving chip IC. The first adhesive layer AL1 may cover the pad electrodes PD and the bump electrodes BE. The first adhesive layer AL1 may bond the pad electrodes PD and the driving chip IC. For example, the first adhesive layer AL1 may bond the display panel DP and the driving chip IC. The first adhesive layer AL1 may include insulating polymer material such as an insulating polymer material. For example, the first adhesive layer AL1 may include an epoxy resin, an acrylic resin, a phenol resin, a melamine resin, a diallylphthalate resin, a urea resin, a polyimide resin, a polystyrene resin, a polyurethane resin, a polyethylene resin, a polyvinyl acetate resin, and the like. These may be used alone or in combination with each other.

The circuit board CB may be disposed in the pad area PA on the substrate SUB. For example, the circuit board CB may partially overlap the pad area PA. For example, a first portion of the circuit board CB may overlap the pad area PA, and a second portion of the circuit board CB might not overlap the pad area PA. The circuit board CB may be bonded to the substrate SUB through the second adhesive layer AL2. Accordingly, the circuit board CB may be electrically connected to the display panel DP. The second adhesive layer AL2 may include the same material as the first adhesive layer AL1.

The pixels PX may receive the driving signal, the control signal, and the power from the circuit board CB. In an embodiment, the circuit board CB may include a printed circuit board ("PCB"), a flexible printed circuit board ("FPCB") or a flexible flat cable ("FFC").

The first direction DR1 and the second direction DR2 crossing the first direction DR1 may define a plane. For example, the second direction DR2 may be perpendicular to the first direction DR1.

The display device DD of the present disclosure may include an organic light emitting diode ("OLED") display device, a liquid crystal display ("LCD") device, a field emission display ("FED") device, a plasma display panel ("PDP") device, an electrophoretic image display ("EPD") device, or a quantum dot display device.

Figure 4:
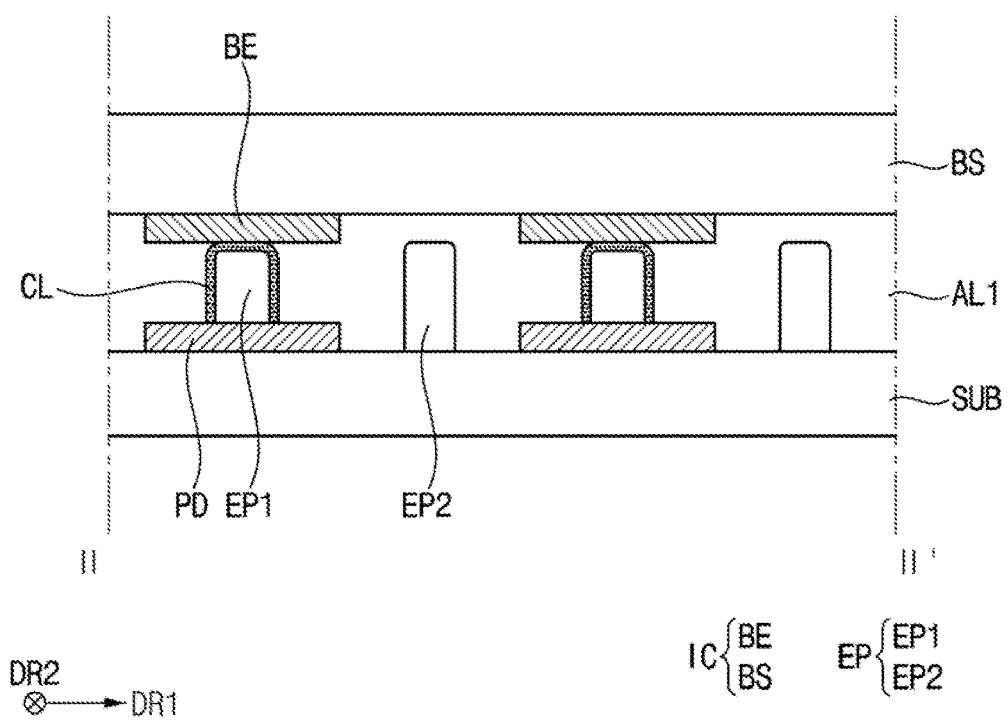
FIG. 4 is a cross-sectional view illustrating an example of a cross section cut along line II-II' of FIG. 3.
Figure 5:
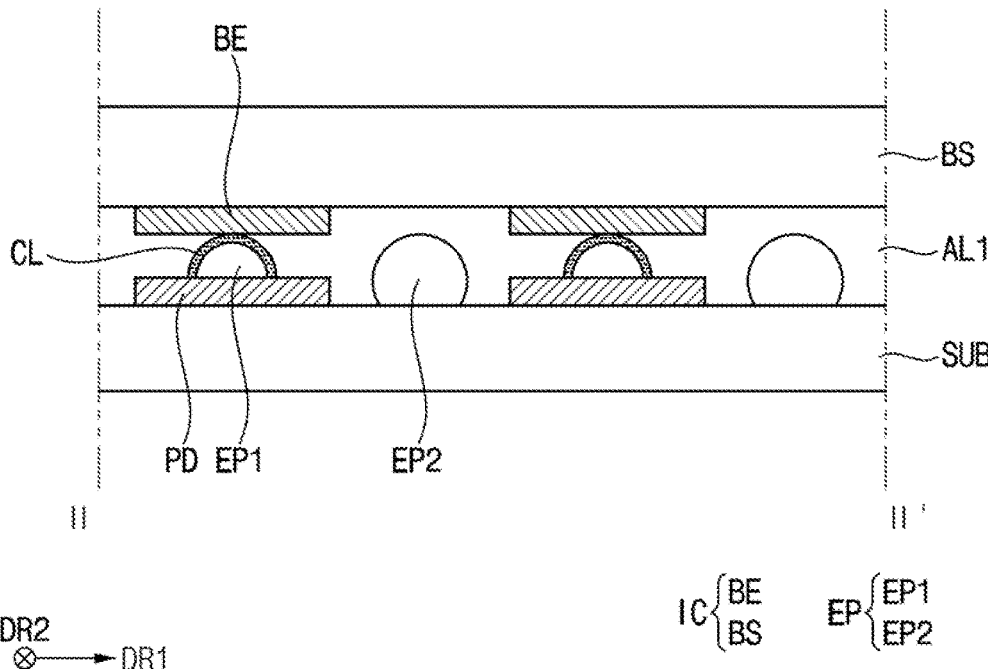
FIGS. 5, 6, 7, and 8 are cross-sectional views illustrating examples of cross-sections taken along line II-II' of FIG. 3.
Figure 6:
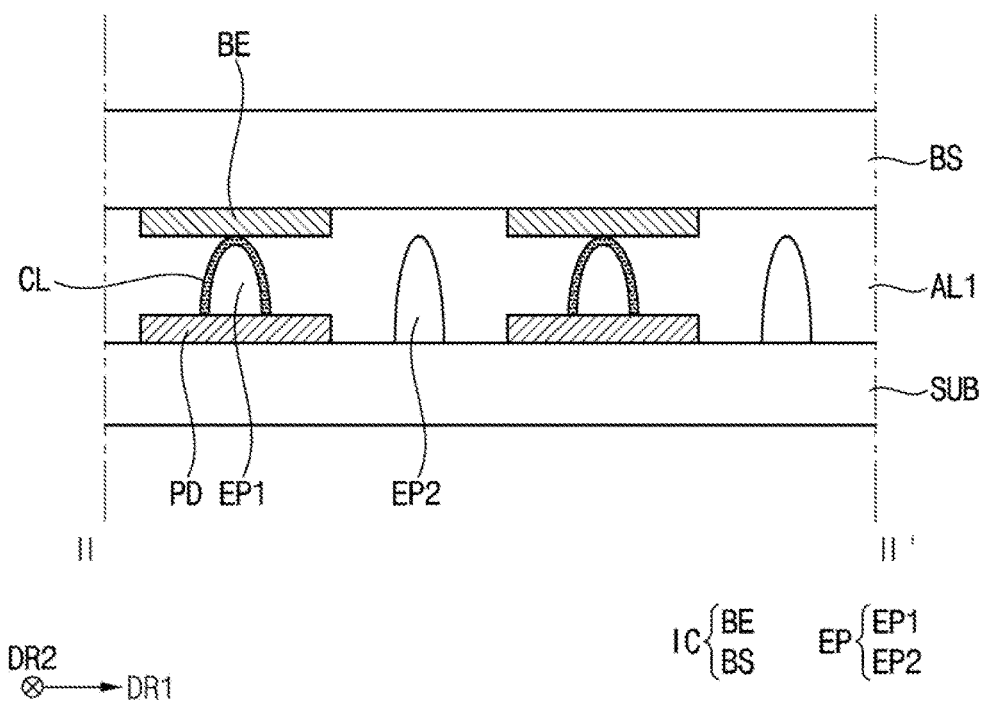
Figure 7:
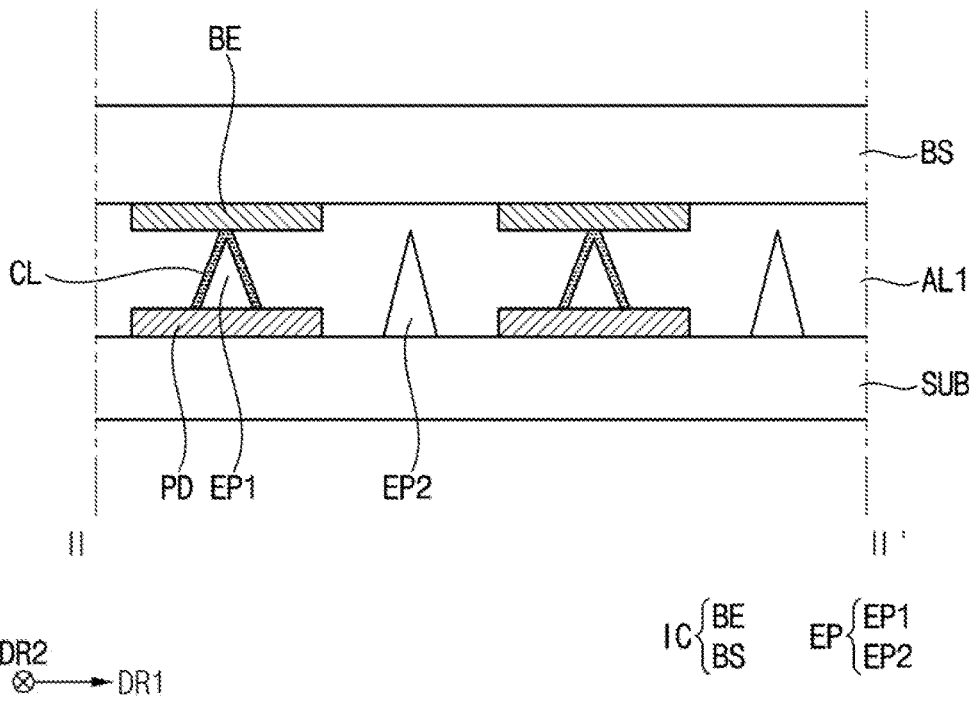
Figure 8:
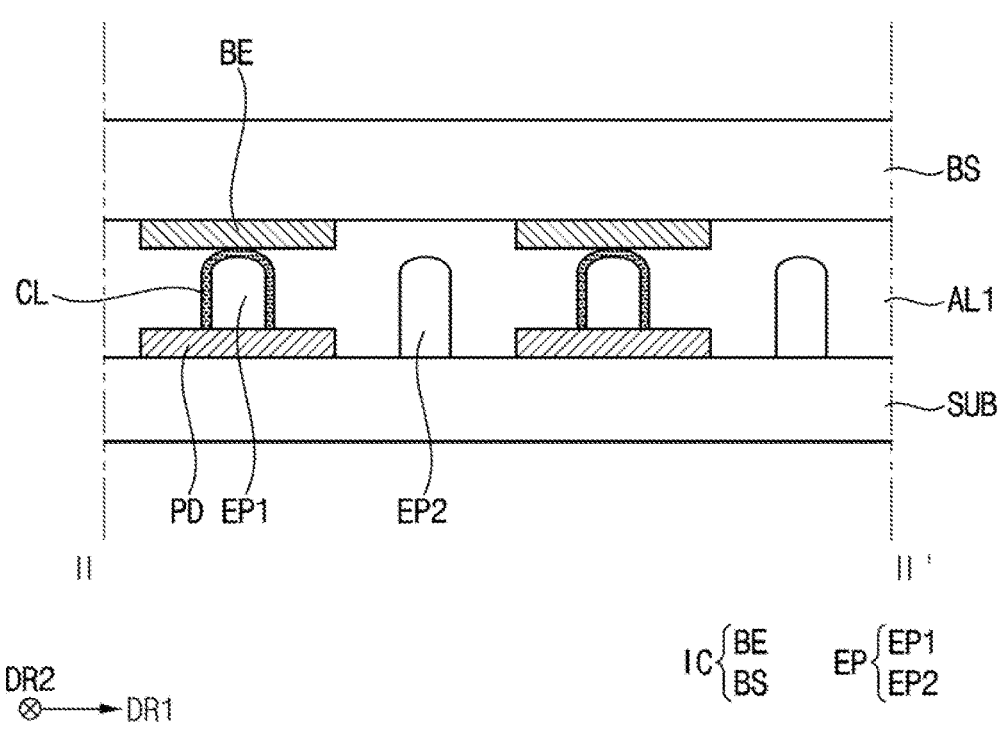

FIG. 4 is a cross-sectional view illustrating an example of a cross section cut along line II-II' of FIG. 3. FIGS. 5, 6, 7, and 8 are cross-sectional views illustrating examples of cross-sections taken along line II-II' of FIG. 3.

Referring to FIGS. 3 and 4, as described above, the plurality of pad electrodes PD, the plurality of elastic protrusions EP, the first adhesive layer AL1, and the driving chip (IC) may be disposed on the substrate SUB.

In an embodiment, the elastic protrusions EP may include a plurality of first elastic protrusions EP1 and a plurality of second elastic protrusions EP2. The first elastic protrusions EP1 may be disposed on each of the pad electrodes PD. For example, a plurality of first elastic protrusions EP1 may be disposed on one pad electrode PD. In a plan view, the second elastic protrusions EP2 may be disposed between the pad electrodes PD on the substrate SUB.

The number of first elastic protrusions EP1 disposed on one pad electrode PD may be equal to the number of the second elastic protrusions EP2 disposed adjacent two pad electrodes (e.g., the input pad electrodes PD1 or the output pad electrodes PD2). For example, the number of the first elastic protrusions EP1 disposed on one pad electrode PD may be four, and the number of the second elastic protrusions EP2 disposed between the two adjacent pad electrodes may be four. Alternatively, the number of the first elastic protrusions EP1 disposed on one pad electrode PD may be different from the number of the second elastic protrusions EP2 disposed between the two adjacent pad electrodes.

Each of the first elastic protrusions EP1 may overlap a central portion of each of the pad electrodes PD, and each of the second elastic protrusions EP2 may overlap a central portion between two adjacent pad electrodes (e.g., the input pad electrodes PD1 or the output pad electrodes PD2). For example, the first elastic protrusions EP1 may be repeatedly arranged along the second direction DR2 to overlap the central portion of each of the pad electrodes PD, and the second elastic protrusions EP2 may be repeatedly arranged along the second direction DR2 to overlap the central portion between the two adjacent pad electrodes.

When viewed in a cross-section, the shape of each of the first elastic protrusions EP1 and the shape of each of the second elastic protrusions EP2 may be the same. For example, each of the elastic protrusions EP may have a rectangular shape with rounded corners when viewed in a cross-section (see FIG. 4). Alternatively, each of the elastic protrusions EP may have a semicircular shape when viewed in a cross-section (see FIG. 5). Alternatively, each of the elastic protrusions EP may have a semielliptical shape when viewed in a cross-section (see FIG. 6). Alternatively, each of the elastic protrusions EP may have a triangular shape when viewed in a cross-section (see FIG. 7). Alternatively, each of the elastic protrusions EP may have a rectangular shape with one rounded side when viewed in a cross-section (see FIG. 8). However, the configuration of the present disclosure is not necessarily limited thereto, and each of the elastic protrusions EP may have various shapes when viewed in a cross-section.

The display device DD may further include a conductive layer CL disposed on each of the first elastic protrusions EP1. In an embodiment, the conductive layer CL may at least partially surround an outer surface of each of the first elastic protrusions EP1. At this time, the outer surface of each of the second elastic protrusions EP2 may be exposed. For example, the conductive layer CL may include a metal, an alloy metal nitride, a conductive metal oxide, a transparent conductive material, and the like. These may be used alone or in combination with each other.

In an embodiment, an upper surface of the conductive layer CL may be positioned at the same level as an upper surface of each of the second elastic protrusions EP2.

Figure 11:
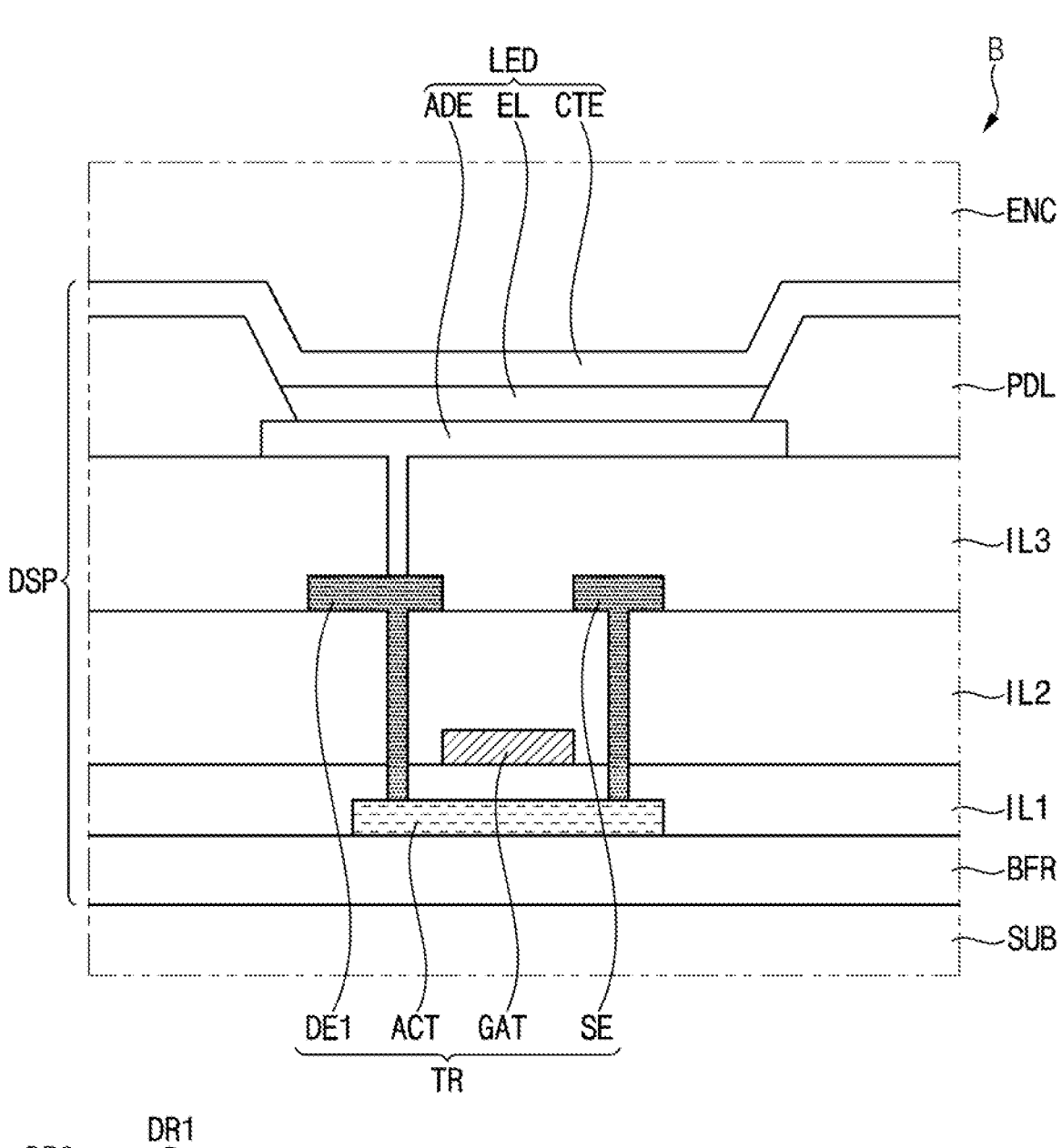
FIG. 11 is an enlarged cross-sectional view of area B of FIG. 2.

In an embodiment, the conductive layer CL may include the same material as a source electrode (e.g., the source electrode SE of FIG. 11) and a drain electrode (e.g., the drain electrode DE of FIG. 11). For example, the conductive layer CL may be formed through the same process as the source electrode and the drain electrode. However, the configuration of the present disclosure is not necessarily limited thereto, and the conductive layer CL may include the same material as the metal layer disposed on a different layer from the source electrode and the drain electrode.

Each of the bump electrodes BE may contact the upper surface of the conductive layer CL and might not contact the second elastic protrusions EP2. For example, the pad electrodes PD and the bump electrodes BE may be electrically connected through the conductive layer CL. For example, the substrate SUB and the driving chip IC may be electrically connected through the conductive layer CL. Alternatively, each of the bump electrodes BE may at least partially contact the upper surface of the conductive layer CL and at least partially overlap the upper surface of each of the second elastic protrusions EP2.

Figure 9:
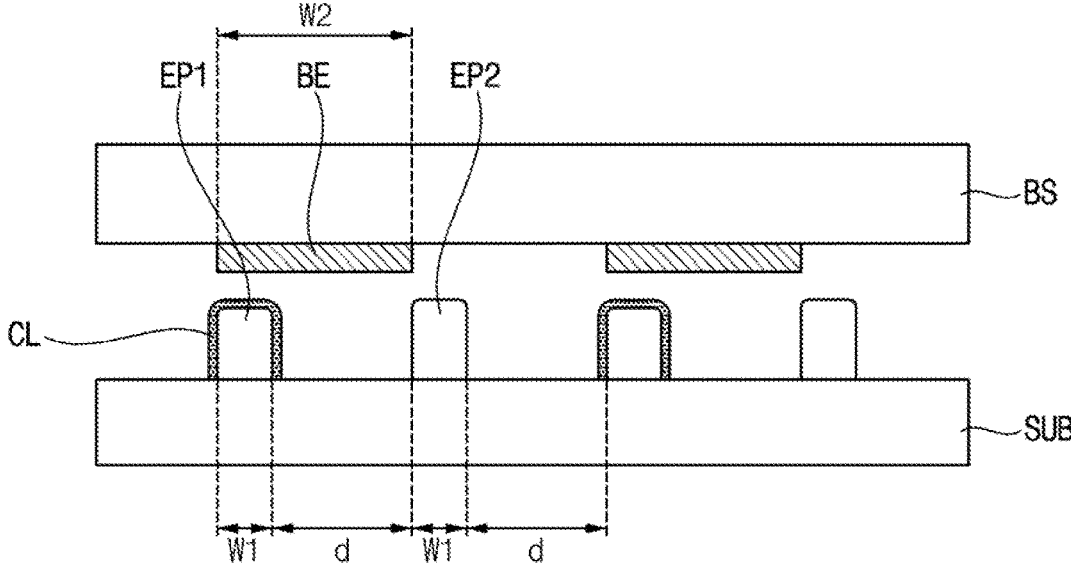
FIGS. 9 and 10 are cross-sectional views illustrating the relationship between a width of a bump electrode, a width of an elastic protrusion, and a gap between adjacent elastic protrusions of FIG. 4.
Figure 10:
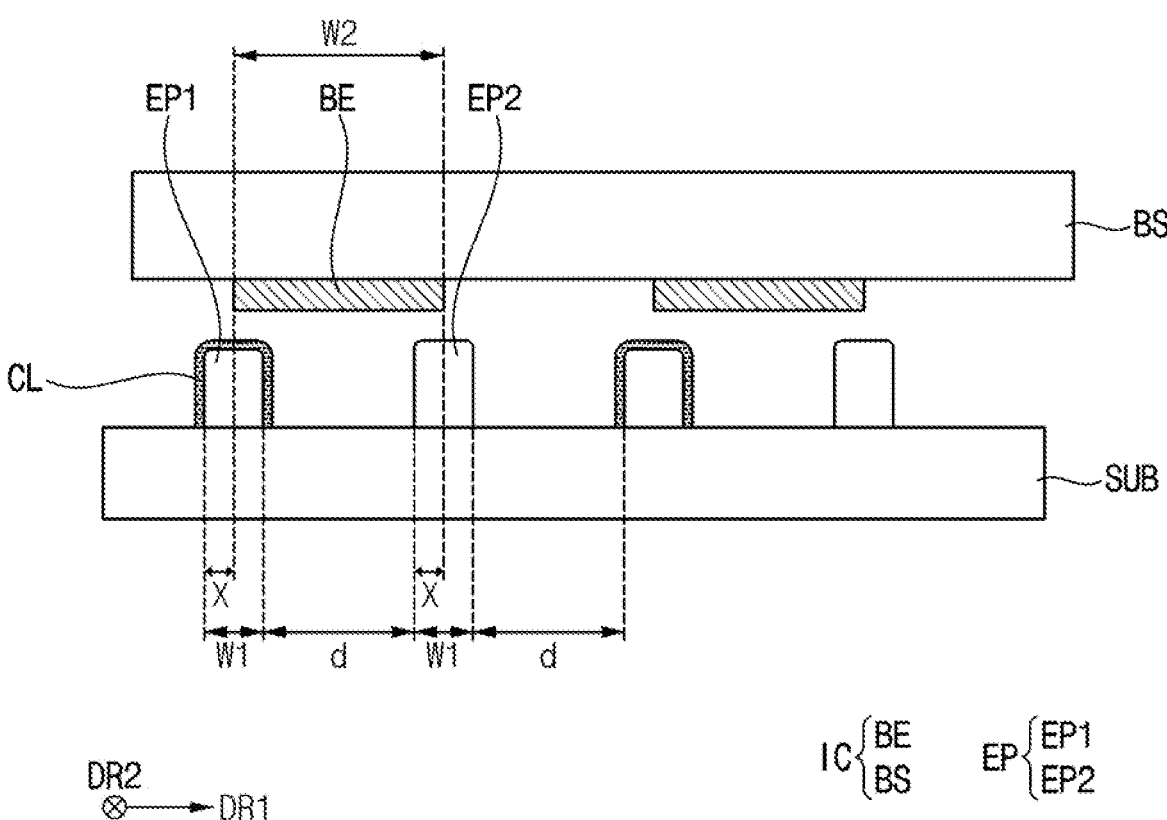

FIGS. 9 and 10 are cross-sectional views illustrating the relationship between a width of a bump electrode, a width of an elastic protrusion, and a gap between adjacent elastic protrusions of FIG. 4. For example, assuming that FIG. 9 is a cross-sectional view illustrating a state in which the driving chip IC is aligned on the substrate SUB, FIG. 10 is a cross-sectional view illustrating a state in which the driving chip IC is shifted by a predetermined distance x in the first direction DR1 from a desired position on the substrate SUB.

Referring to FIGS. 9 and 10, in an embodiment, a width W1 of each of the first elastic protrusions EP1 may equal to the width W1 of each of the second elastic protrusions EP2. Here, each of the width W1 of the first elastic protrusion EP1 and the width W1 of the second elastic protrusion EP2 may mean a width in the first direction DR1.

In an embodiment, when viewed in a cross-section, the elastic protrusions EP may be spaced apart from each other at equal distance d along the first direction DR1. For example, when viewed in a cross-section, the distance d between the first elastic protrusion EP1 positioned in a first column and the second elastic protrusion EP2 positioned in the second column adjacent to the first column may be equal to the distance d between the second elastic protrusion EP2 positioned in the second row and the first elastic protrusion EP1 positioned in a third row adjacent to the second row.

In an embodiment, a width W2 of each of the bump electrodes BE may be N times the sum of the width W1 of each elastic protrusion EP and the distance d between two adjacent elastic protrusions EP in the first direction DR1 (where the N is a positive integer). For example, the width W2 of each of the bump electrodes BE may equal to the sum of the width W1 of each elastic protrusion EP and the distance d between two adjacent elastic protrusions EP in the first direction DR1.

When the above conditions are satisfied, the sum of the widths of the portions where each of the bump electrodes BE overlaps the elastic protrusions BP may be N times the width W1 of each of the elastic protrusions BP (where, the N is a positive integer). For example, as illustrated in FIG. 9, the width W1 of the portion where each of the bump electrodes BE overlaps the first elastic protrusion EP1 may be equal to the width W1 of each of the elastic protrusions EP1. In addition, as illustrated in FIG. 10, the sum of the width (e.g., a difference between the width W1 of the first elastic protrusion EP1 and the distance x shifted at the desired position of the driving chip IC) of the portion where each of the bump electrodes BE overlaps the first elastic protrusion BP1 and the width x of the portion where each of the bump electrodes BE overlaps the second elastic protrusion BP2 may be equal to the width W1 of each of the elastic protrusions EP.

As described above, when the width W2 of each of the bump electrodes BE is N times the sum of the width W1 of each elastic protrusion EP and the distance d between two adjacent elastic protrusions EP in the first direction DR1 (where the N is a positive integer), the magnitude of the pressure pressing the substrate SUB in a state where driving chip IC is aligned on the substrate SUB may be the same as the magnitude of the pressure pressing the substrate SUB in a state where the driving chip IC is shifted from the desired position.

A driving chip may be bonded to a display panel through an anisotropic conductive film ("ACF") including an adhesive layer and a plurality of conductive balls arranged in the adhesive layer. However, in the process of bonding the driving chip to the display panel, since the conductive balls are concentrated on the side surfaces of the electrodes, a short defect occurred between the adjacent electrodes, or since the conductive balls are properly disposed between the electrodes, an open defect occurred.

The display device DD, according to an embodiment of the present disclosure, may include the plurality of pad electrodes PD disposed in the pad area PA on a substrate SUB, the plurality of first elastic protrusions EP1 disposed on each of the pad electrodes PD, the plurality of second elastic protrusions EP2 disposed between the pad electrodes PD on the substrate SUB when viewed from in a plan view, and the driving chip IC. The driving chip IC may include the base portion BS facing the substrate SUB and the plurality of bump electrodes BE attached to the lower surface of the base portion BS. At this time, the width W2 of each of the bump electrodes BE may be N times the sum of the width W1 of each elastic protrusion EP and the distance d between two adjacent elastic protrusions EP (where the N is a positive integer). Accordingly, a short defect or an open defect of the display device DD occurring in the process of bonding the driving chip IC to the substrate SUB may be reduced in frequency and/or severity.

FIG. 11 is an enlarged cross-sectional view of area B of FIG. 2.

Referring to FIGS. 2 and 11, the display panel DP of the display device DD, according to an embodiment, may include the substrate SUB, the display portion DSP disposed on the substrate SUB, and the encapsulation layer ENC disposed on the display portion DSP. Here, the display portion DSP may include a buffer layer BUF, a transistor TR, a first insulating layer IL1, a second insulating layer IL2, a third insulating layer IL3, a pixel defining layer PDL, and a light emitting element LED. The transistor TR may include an active pattern ACT, a gate electrode GAT, a source electrode SE, and a drain electrode DE, and the light emitting element LED may include an anode electrode ADE, a light emitting layer EL, and a cathode electrode CTE.

The substrate SUB may include a transparent material or an opaque material. The substrate SUB may be made of a transparent resin substrate. An example of a transparent resin substrate that can be used as the substrate SUB may include a polyimide substrate. In this case, the polyimide substrate may include a first polyimide layer, a barrier film layer, and a second polyimide layer. In an embodiment, the substrate SUB may include a quartz substrate, a synthetic quartz substrate, a calcium fluoride substrate, an F-doped quartz substrate, a soda lime glass substrate, a non-alkali glass substrate, and the like. These may be used alone or in combination with each other.

The buffer layer BUF may be disposed on the substrate SUB. The buffer layer BUF may prevent diffusion of metal atoms or impurities from the substrate SUB into the transistor TR. In addition, the buffer layer BUF may increase flatness of the surface of the substrate SUB when the surface of the substrate SUB is not uniform. For example, the buffer layer BUF may include an inorganic material such as silicon oxide, silicon nitride, silicon oxynitride, and the like. These may be used alone or in combination with each other.

The active pattern ACT may be disposed on the buffer layer BUF. The active pattern ACT may include a metal oxide semiconductor, an inorganic semiconductor (e.g., amorphous silicon, poly silicon), or an organic semiconductor. The active pattern ACT may include a source region, a drain region, and a channel region positioned between the source region and the drain region.

The metal oxide semiconductor may include a two-component compound ("$AB_x$"), a ternary compound ("$AB_xC_y$"), a four-component compound ("$AB_xC_yD_z$"), and the like containing indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and the like. For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), indium gallium zinc oxide ("IGZO"), and the like. These may be used alone or in combination with each other.

The first insulating layer IL1 may be disposed on the buffer layer BUF. The first insulating layer IL1 may sufficiently cover the active pattern ACT, and may have a substantially flat upper surface without creating a step around the active pattern ACT. Alternatively, the first insulating layer IL1 may cover the active pattern ACT and may be disposed along the profile of the active pattern ACT with a uniform thickness. For example, the first insulating layer IL1 may include an inorganic material such as silicon oxide ("$SiO_x$"), silicon nitride ("$SiN_x$"), silicon carbide ("$SiC_x$"), silicon oxynitride ("$SiO_xN_y$"), silicon oxycarbide ("$SiO_xC_y$"), and the like. These may be used alone or in combination with each other.

The gate electrode GAT may be disposed on the first insulating layer IL1. The gate electrode GAT may overlap the channel region of the active pattern ACT. The gate electrode GAT may include a metal, an alloy metal nitride, a conductive metal oxide, a transparent conductive material, and the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), and the like. Examples of the conductive metal oxide may include indium tin oxide, indium zinc oxide, and the like. In addition, examples of the metal nitride may include aluminum nitride ("$AlN_x$"), tungsten nitride ("$WN_x$"), chromium nitride ("$CrN_x$"), and the like. These may be used alone or in combination with each other.

The second insulating layer IL2 may be disposed on the first insulating layer IL1. The second insulating layer IL2 may sufficiently cover the gate electrodes GAT, and may have a substantially flat upper surface without creating a step around the gate electrodes GAT. Alternatively, the second insulating layer IL2 may cover the gate electrode GAT and may be disposed along the profile of each gate electrode GAT with a uniform thickness. For example, the second insulating layer IL2 may include an inorganic material such as silicon oxide, silicon nitride, silicon carbide, silicon oxynitride, silicon oxycarbide, and the like. These may be used alone or in combination with each other.

The source electrode SE and the drain electrode DE may be disposed on the interlayer insulating layer ILD. The source electrode SE1 may be connected to the source region of the active pattern ACT through a contact hole passing through a first portion of the first insulating layer IL1 and the second insulating layer IL2. The drain electrode may be connected to the drain region of the active pattern ACT through a contact hole passing through a second portion of the first insulating layer IL1 and the second insulating layer IL2. For example, each of the source electrode SE and the drain electrode DE may include a metal, an alloy, a metal nitride, a conductive metal oxide, a transparent conductive material, and the like. These may be used alone or in combination with each other.

Accordingly, the transistor TR including the active pattern ACT, the gate electrode GAT, the source electrode SE, and the drain electrode DE may be disposed on the substrate SUB in the display area DA.

The third insulating layer IL3 may be disposed on the second insulating layer IL2. The third insulating layer IL3 may sufficiently cover the source electrode SE and the drain electrode DE. The third insulating layer IL3 may include an inorganic material or an organic material. For example, the third insulating layer IL3 may include an organic material such as phenolic resin, polyacrylates resin, polyimides rein, polyamides resin, siloxane resin, epoxy resin, and the like. These may be used alone or in combination with each other.

The anode electrode ADE may be disposed on the third insulating layer IL3. The anode electrode ADE may be connected to the drain electrode DE of the transistor TR through a contact hole passing through the third insulating layer IL3. For example, the anode electrode ADE may include a metal, an alloy, a metal nitride, a conductive metal oxide, a transparent conductive material, and the like. These may be used alone or in combination with each other. In an embodiment, the anode electrode ADE may have a stacked structure including ITO/Ag/ITO.

The pixel defining layer PDL may be disposed on the third insulating layer IL3. The pixel defining layer PDL may cover both sides of the anode electrode ADE. The pixel defining layer PDL may include an organic material or an organic material. For example, the pixel defining layer PDL may include an organic material such as an epoxy resin, a siloxane resin, and the like. These may be used alone or in combination with each other. In an embodiment, the pixel defining layer PDL may further include a light blocking material containing a black pigment, black dye, and the like.

The light emitting layer EL may be disposed on the anode electrode ADE. The light emitting layer EL may include an organic material that emits light of a predetermined color. For example, the light emitting layer EL may include an organic material that emits red light, green light, or blue light.

The cathode electrode CTE may be disposed on the light emitting layer EL and the pixel defining layer PDL. For example, the cathode electrode CTE may include a metal, an alloy, a metal nitride, a conductive metal oxide, a transparent conductive material, and the like. These may be used alone or in combination with each other.

Accordingly, the light emitting element LED including the anode electrode ADE, the light emitting layer EL, and the cathode electrode CTE may be disposed in the display area DA on the substrate SUB.

The encapsulation layer ENC may be disposed on the cathode electrode CTE. The encapsulation layer ENC may prevent impurities, moisture, air, and the like from permeating the light emitting element LED from the outside. The encapsulation layer ENC may include at least one inorganic layer and at least one organic layer. For example, the inorganic layer may include silicon oxide, silicon nitride, silicon oxynitride, and the like. These may be used alone or in combination with each other. The organic layer may include a polymer cured material such as polyacrylate.

Figure 12:
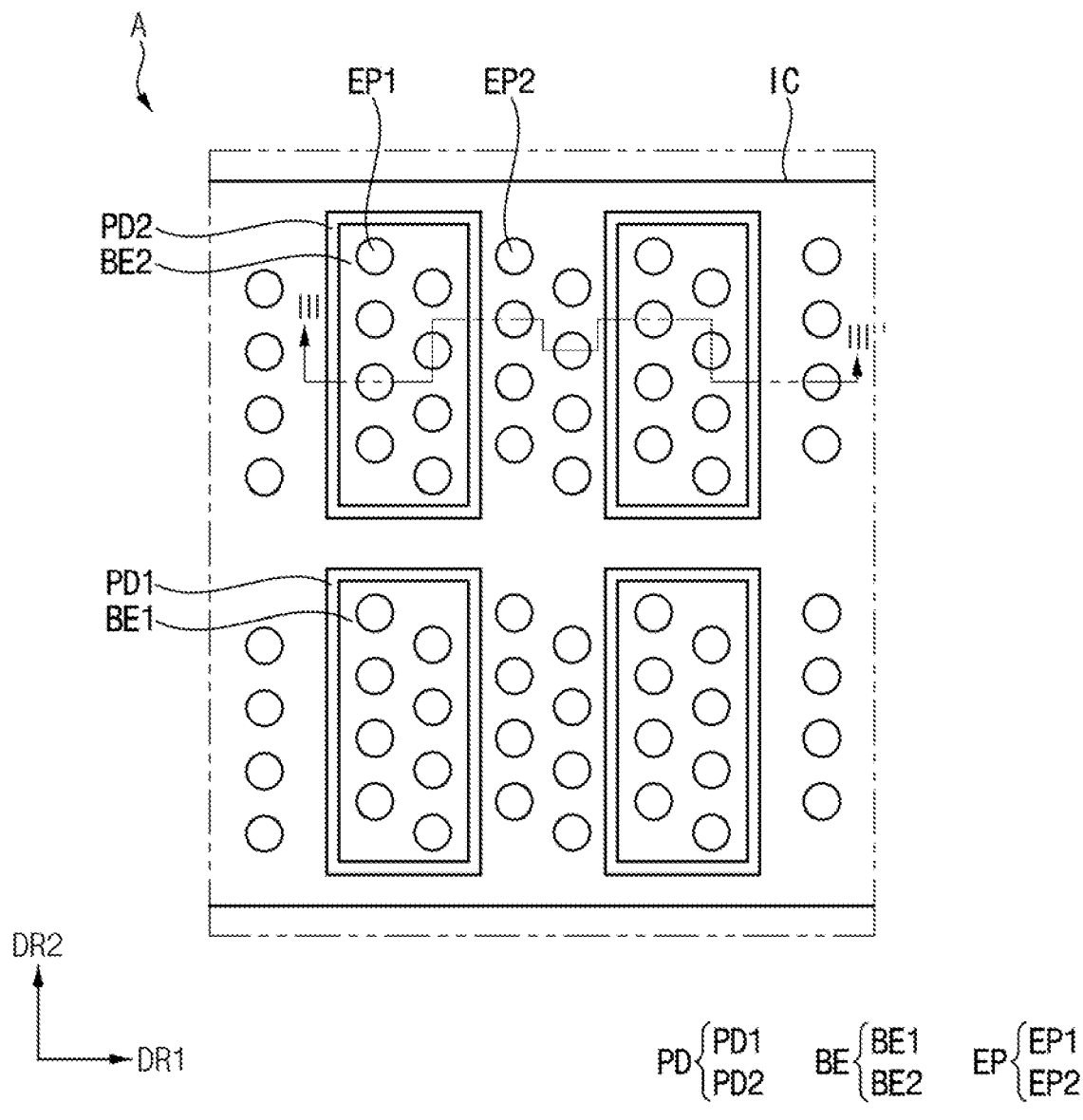
FIG. 12 is an enlarged plan view of an example of area A of FIG. 1.
Figure 13:
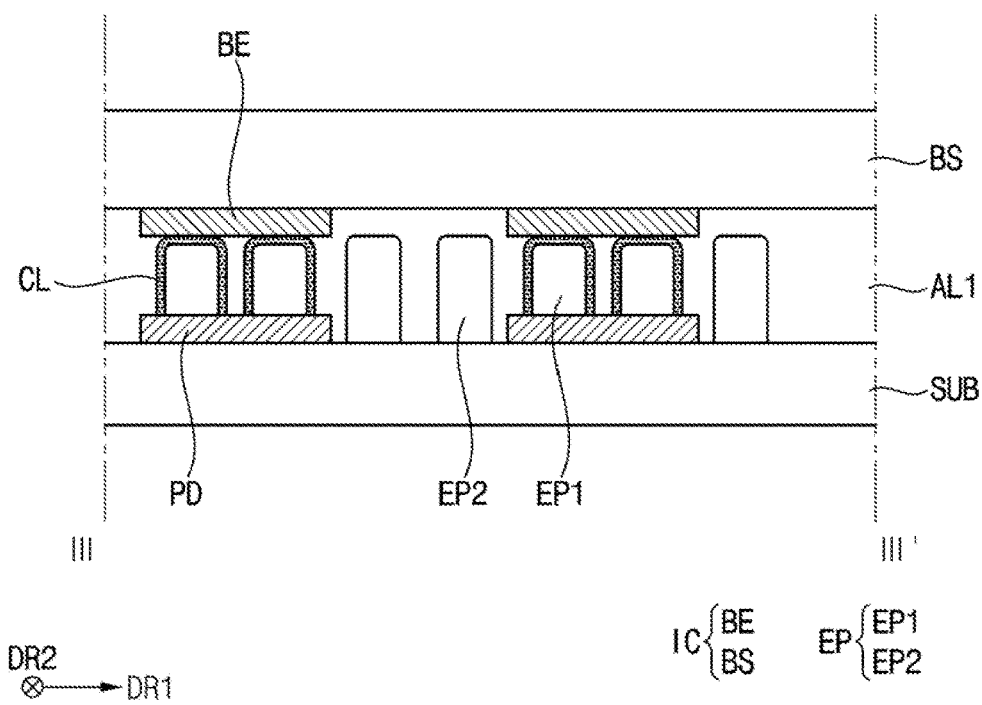
FIG. 13 is a cross-sectional view taken along line III-III' of FIG. 12.
Figure 14:
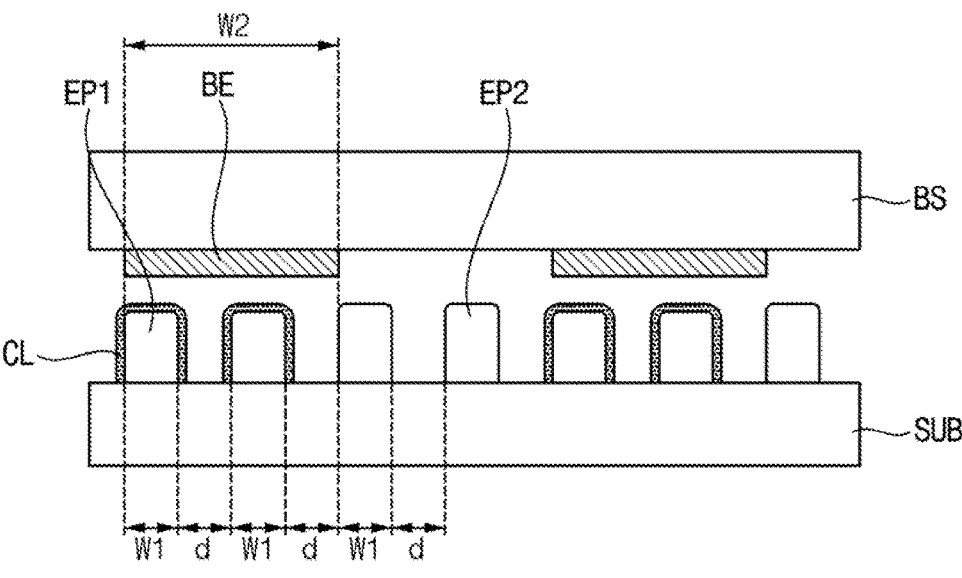
FIGS. 14 and 15 are cross-sectional views illustrating the relationship between a width of a bump electrode, a width of an elastic protrusion, and a gap between adjacent elastic protrusions of FIG. 13.
Figure 15:
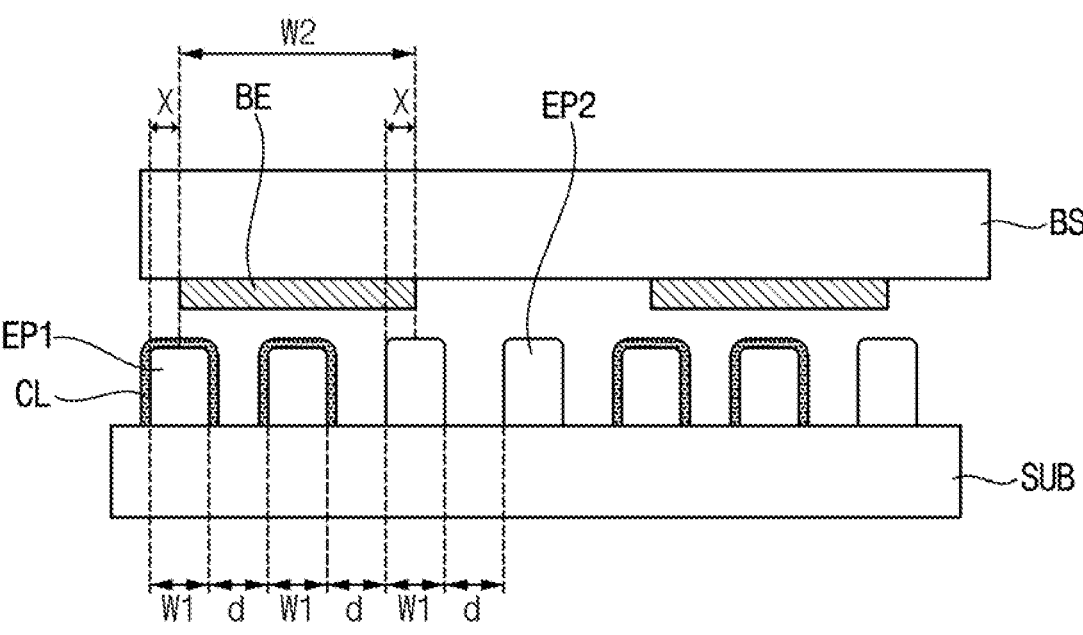

FIG. 12 is an enlarged plan view of an example of area A of FIG. 1. FIG. 13 is a cross-sectional view taken along line III-III' of FIG. 12. FIGS. 14 and 15 are cross-sectional views illustrating the relationship between a width of a bump electrode, a width of an elastic protrusion, and a gap between adjacent elastic protrusions of FIG. 13.

For example, assuming that FIG. 14 is a cross-sectional view illustrating a state in which the driving chip IC is aligned on the substrate SUB, FIG. 15 is a cross-sectional view illustrating a state in which the driving chip IC is shifted by a predetermined distance x in the first direction DR1 from a desired position on the substrate SUB.

Referring to FIGS. 12, 13, 14, and 15, the plurality of pad electrodes PD, the plurality of elastic protrusions BP, the first adhesive layer AL1, and the driving chip IC may be disposed in the pad area PA on the substrate SUB. However, the display device described with reference to FIGS. 12, 13, 14, and 15 may be substantially the same as or similar to the display device DD described with reference to FIGS. 3, 4, 5, 6, 7, 8, 9, and 10 except for the number of the elastic protrusions EP. In the following, to the extent that a detailed description of an element has been omitted, it may be assumed that the element is at least similar to a corresponding element that has been described elsewhere within the present disclosure.

The number of first elastic protrusions EP1 disposed on one pad electrode PD may be equal to the number of the second elastic protrusions EP2 disposed adjacent two pad electrodes (e.g., the input pad electrodes PD1 or the output pad electrodes PD2). For example, the number of the first elastic protrusions EP1 disposed on one pad electrode PD may be eight, and the number of the second elastic protrusions EP2 disposed between the two adjacent pad electrodes may be eight. Alternatively, the number of the first elastic protrusions EP1 disposed on one pad electrode PD may be different from the number of the second elastic protrusions EP2 disposed between the two adjacent pad electrodes.

In an embodiment, in a plan view, the first elastic protrusions EP1 may be arranged in a first zigzag pattern, and the second elastic protrusions EP2 may be arranged in a second zigzag pattern. For example, in a plan view, the arrangement method of the first elastic protrusions EP1 and the arrangement method of the second elastic protrusions EP2 may be the same. However, the configuration of the present disclosure is not necessarily limited thereto, and the arrangement method of the first elastic protrusions EP1 and the arrangement method of the second elastic protrusions EP2 may be different in a plan view.

In an embodiment, the width W1 of each of the first elastic protrusions EP1 may be equal to the width W1 of each of the second elastic protrusions EP2.

In an embodiment, when viewed in a cross-section, the elastic protrusions EP may be spaced apart from each other at equal distance d along the first direction DR1.

In an embodiment, a width W2 of each of the bump electrodes BE may be N times the sum of the width W1 of each elastic protrusion EP and the distance d between two adjacent elastic protrusions EP in the first direction DR1 (where the N is a positive integer). For example, the width W2 of each of the bump electrodes BE may be twice the sum of the width W1 of each elastic protrusion EP and the distance d between two adjacent elastic protrusions EP in the first direction DR1.

When the above conditions are satisfied, the sum of the widths of the portions where each of the bump electrodes BE overlaps the elastic protrusions BP may be N times the width W1 of each of the elastic protrusions BP (where, the N is a positive integer). For example, as illustrated in FIG. 14, the width W1 of the portion where each of the bump electrodes BE overlaps the first elastic protrusion EP1 may be two times the width W1 of each of the elastic protrusions EP1. In addition, as illustrated in FIG. 15, the sum of the width of the portion where each of the bump electrodes BE overlaps the first elastic protrusion BP1 and the width x of the portion where each of the bump electrodes BE overlaps the second elastic protrusion BP2 may be two times the width W1 of each of the elastic protrusions EP.

Figure 16:
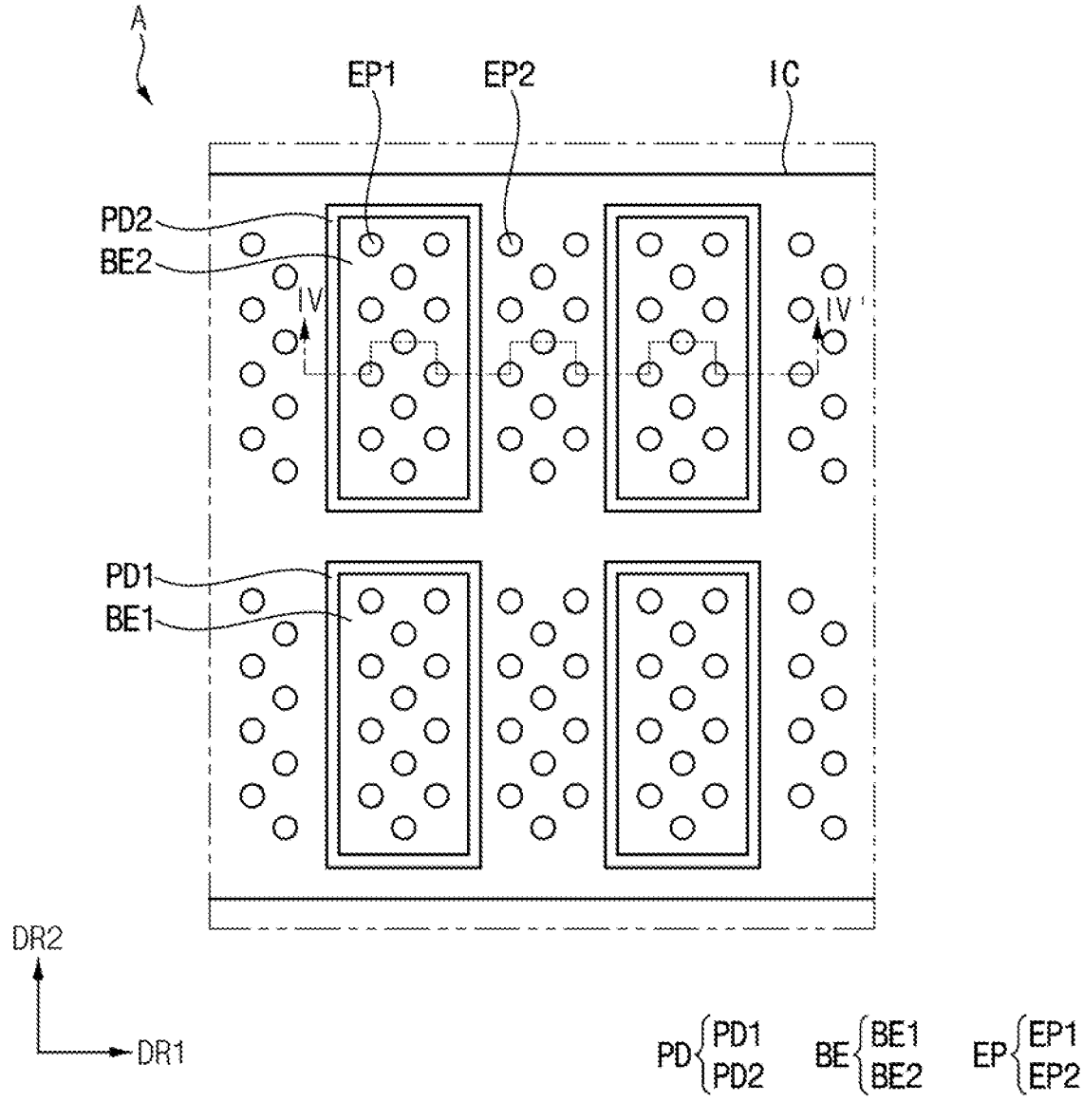
FIG. 16 is an enlarged plan view of an example of area A of FIG. 1.
Figure 17:
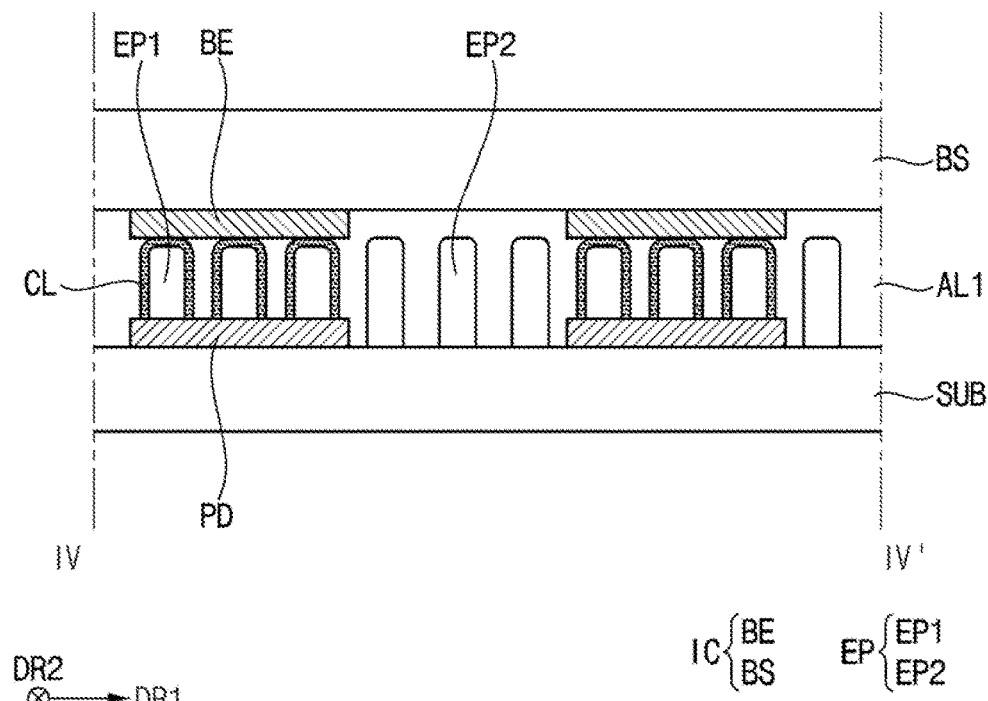
FIG. 17 is a cross-sectional view taken along line IV-IV' of FIG. 16.
Figure 18:
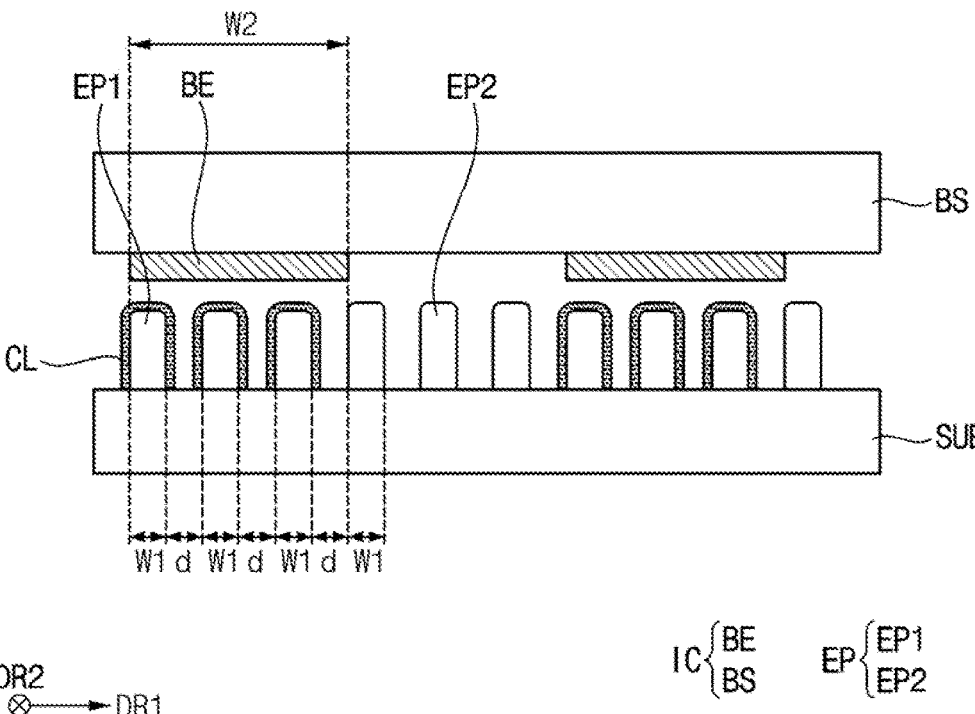
FIGS. 18 and 19 are cross-sectional views illustrating the relationship between a width of a bump electrode, a width of an elastic protrusion, and a gap between adjacent elastic protrusions of FIG. 17.
Figure 19:
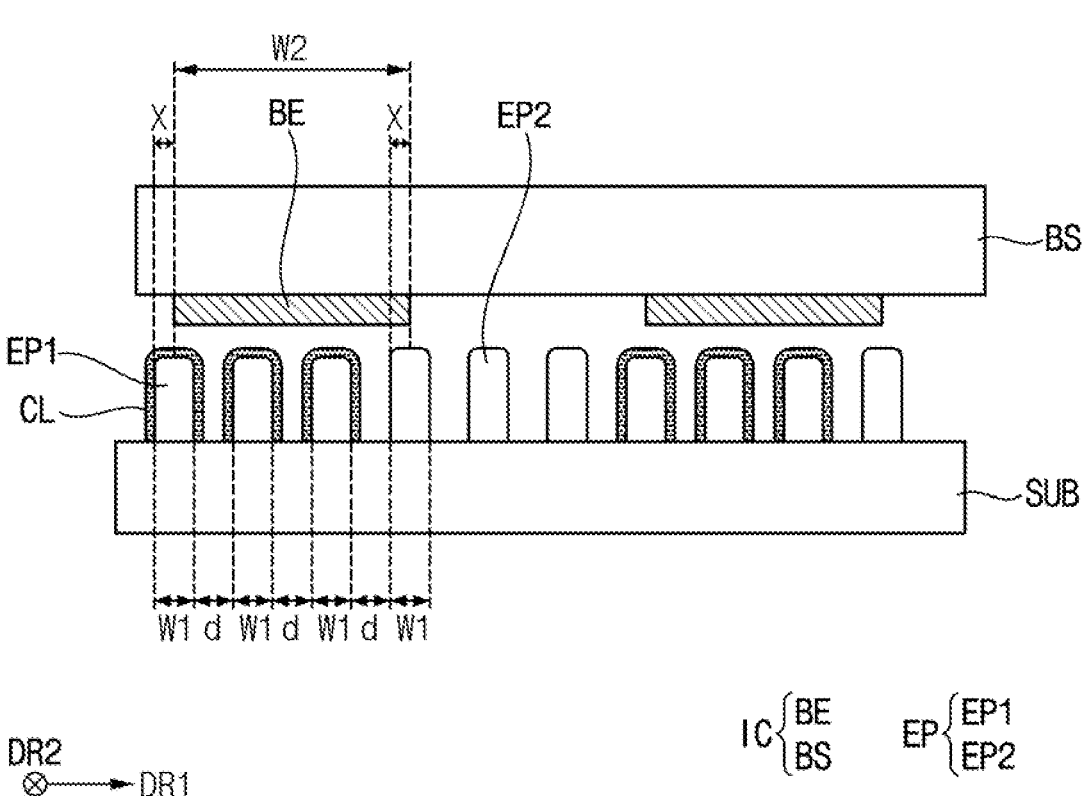

FIG. 16 is an enlarged plan view of an example of area A of FIG. 1. FIG. 17 is a cross-sectional view taken along line IV-IV' of FIG. 16. FIGS. 18 and 19 are cross-sectional views illustrating the relationship between a width of a bump electrode, a width of an elastic protrusion, and a gap between adjacent elastic protrusions of FIG. 17.

For example, assuming that FIG. 18 is a cross-sectional view illustrating a state in which the driving chip IC is aligned on the substrate SUB, FIG. 19 is a cross-sectional view illustrating a state in which the driving chip IC is shifted by a predetermined distance x in the first direction DR1 from a desired position on the substrate SUB.

Referring to FIGS. 16, 17, 18, and 19, the plurality of pad electrodes PD, the plurality of elastic protrusions BP, the first adhesive layer AL1, and the driving chip IC may be disposed in the pad area PA on the substrate SUB. However, the display device described with reference to FIGS. 16, 17, 18, and 19 may be substantially the same as or similar to the display device DD described with reference to FIGS. 3, 4, 5, 6, 7, 8, 9, and 10 except for the number of the elastic protrusions EP. In the following, to the extent that a detailed description of an element has been omitted, it may be assumed that the element is at least similar to a corresponding element that has been described elsewhere within the present disclosure.

The number of first elastic protrusions EP1 disposed on one pad electrode PD may be equal to the number of the second elastic protrusions EP2 disposed adjacent two pad electrodes (e.g., the input pad electrodes PD1 or the output pad electrodes PD2). For example, the number of the first elastic protrusions EP1 disposed on one pad electrode PD may be twelve, and the number of the second elastic protrusions EP2 disposed between the two adjacent pad electrodes may be twelve. Alternatively, the number of the first elastic protrusions EP1 disposed on one pad electrode PD may be different from the number of the second elastic protrusions EP2 disposed between the two adjacent pad electrodes.

In an embodiment, in a plan view, the first elastic protrusions EP1 may be arranged in a first zigzag pattern, and the second elastic protrusions EP2 may be arranged in a second zigzag pattern. For example, in a plan view, the arrangement method of the first elastic protrusions EP1 and the arrangement method of the second elastic protrusions EP2 may be the same. However, the configuration of the present disclosure is not necessarily limited thereto, and the arrangement method of the first elastic protrusions EP1 and the arrangement method of the second elastic protrusions EP2 may be different, in a plan view.

In an embodiment, the width W1 of each of the first elastic protrusions EP1 may be equal to the width W1 of each of the second elastic protrusions EP2.

In an embodiment, when viewed in a cross-section, the elastic protrusions EP may be spaced apart from each other at equal distance d along the first direction DR1.

In an embodiment, a width W2 of each of the bump electrodes BE may be N times the sum of the width W1 of each elastic protrusion EP and the distance d between two adjacent elastic protrusions EP in the first direction DR1 (where the N is a positive integer). For example, the width W2 of each of the bump electrodes BE may be three times the sum of the width W1 of each elastic protrusion EP and the distance d between two adjacent elastic protrusions EP in the first direction DR1.

When the above conditions are satisfied, the sum of the widths of the portions where each of the bump electrodes BE overlaps the elastic protrusions BP may be N times the width W1 of each of the elastic protrusions BP (where, the N is a positive integer). For example, as illustrated in FIG. 18, the width W1 of the portion where each of the bump electrodes BE overlaps the first elastic protrusion EP1 may be three times the width W1 of each of the elastic protrusions EP1. In addition, as illustrated in FIG. 19, the sum of the width of the portion where each of the bump electrodes BE overlaps the first elastic protrusion BP1 and the width x of the portion where each of the bump electrodes BE overlaps the second elastic protrusion BP2 may be three times the width W1 of each of the elastic protrusions EP.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not necessarily to be construed as limiting thereof. Although a few embodiments have been described, those skilled in the art will readily appreciate that many modifications are possible in the embodiments without materially departing from the novel teachings and various aspects of the present inventive concept. Accordingly, all such modifications are intended to be included within the scope of the present disclosure.

What is claimed is:

1. A display device, comprising:
a substrate including a display area and a pad area;
a plurality of pad electrodes disposed in the pad area on the substrate;
a plurality of elastic protrusions including a plurality of first elastic protrusions disposed on the pad electrodes and a plurality of second elastic protrusions disposed between neighboring pad electrodes of the plurality of pad electrodes;
a conductive layer disposed on the first elastic protrusions and not disposed on the second elastic protrusions; and
a driving chip overlapping the pad area and including a base portion facing the substrate and a plurality of bump electrodes attached to one surface of the base portion and overlapping the pad electrodes,
wherein each of the plurality of first elastic protrusions are disposed in a one-by-one alternating pattern with each of the plurality of second elastic protrusions.

2. The display device of claim 1, wherein each of the elastic protrusions includes an organic polymer material.

3. The display device of claim 1, wherein a cross-sectional shape of each of the elastic protrusions is rectangular, rounded, semicircular, semielliptical, triangular, or rectangular with rounded corners.

4. The display device of claim 1, wherein an upper surface of the conductive layer is positioned at a same level as an upper surface of each of the second elastic protrusions.

5. The display device of claim 1, wherein the pad electrodes and the bump electrodes are repeatedly arranged along a first direction, and each of the pad electrodes and each of the bump electrodes extends in a second direction crossing the first direction.

6. The display device of claim 5, wherein a width of each of the first elastic protrusions is equal to a width of each of the second elastic protrusions.

7. The display device of claim 6, wherein the first elastic protrusions and the second elastic protrusions are spaced apart from each other at equal distance along the first direction.

8. The display device of claim 7, wherein a width of each of the bump electrodes is N times a sum of the width of each of the elastic protrusions and a distance between two elastic protrusions adjacent in the first direction among the elastic protrusions, where, N is a positive integer.

9. The display device of claim 5, wherein a number of the first elastic protrusions disposed on one pad electrodes among the pad electrodes is equal to a number of the second elastic protrusions disposed between two pad electrodes adjacent in the first direction among the pad electrodes.

10. The display device of claim 5, wherein a number of the first elastic protrusions disposed on one pad electrodes among the pad electrodes is different from a number of the second elastic protrusions disposed between two pad electrodes adjacent in the first direction among the pad electrodes.

11. The display device of claim 1, wherein the first elastic protrusions overlap a central portion of each of the pad electrodes, and the second elastic protrusions overlap a central portion between two adjacent pad electrodes among the pad electrodes.

12. The display device of claim 1, wherein the first elastic protrusions are disposed in a first zigzag pattern and the second elastic protrusions are disposed in a second zigzag pattern.

13. The display device of claim 1, further comprising:
a transistor including an active pattern, a gate electrode, a source electrode, and a drain electrode sequentially disposed in the display area on the substrate,
wherein the conductive layer includes a same material as the source electrode and the drain electrode.

14. The display device of claim 1, further comprising:
an adhesive layer disposed between the substrate and the driving chip, and covering the pad electrode and the bump electrodes.

15. The display device of claim 14, wherein the adhesive layer includes an insulating polymer material.

16. The display device of claim 1, wherein an upper surface of the conductive layer contacts the bump electrodes.

17. The display device of claim 1, wherein an upper surface of the conductive layer contacts the bump electrodes and an upper surface of each of the second elastic protrusions at least partially contacts each of the bump electrodes.

18. A display device, comprising:
a substrate including a display area and a pad area;
a plurality of pad electrodes disposed in the pad area on the substrate;
a driving chip overlapping the pad area and including a base portion facing the substrate and a plurality of bump electrodes attached to one surface of the base portion and overlapping the pad electrodes; and
a plurality of elastic protrusions disposed in the pad area on the substrate and including:
a plurality of first elastic protrusions disposed on each of the pad electrodes; and
a plurality of second elastic protrusions disposed between neighboring pad electrodes of the plurality of pad electrodes, spaced apart from the first elastic protrusions in a horizontal direction parallel to a surface of the substrate, and disposed directly on the substrate,
wherein at least one of the elastic protrusions overlaps the bump electrodes,
wherein a sum of widths of portions of the elastic protrusions overlapping one bump electrode among the bump electrodes is N times a width of each of the elastic protrusions, where, N is a positive integer, and where all widths are all measured in the horizontal direction, and
wherein each of the plurality of first elastic protrusions are disposed in a one-by-one alternating pattern with each of the plurality of second elastic protrusions.

19. The display device of claim 18, wherein each of the elastic protrusions includes an organic polymer material.

20. The display device of claim 18, wherein a cross-sectional shape of each of the elastic protrusions is rectangular, rounded, semicircular, semielliptical, triangular, or a rectangular with rounded corners.

21. The display device of claim 18, further comprising:
a conductive layer disposed on each of the first elastic protrusions and not disposed on the second elastic protrusions.

22. The display device of claim 18, wherein the pad electrodes and the bump electrodes are repeatedly arranged along a first direction, and each of the pad electrodes and each of the bump electrodes extends in a second direction crossing the first direction.

23. The display device of claim 22, wherein a width of each of the first elastic protrusions is equal to a width of each of the second elastic protrusions.

24. The display device of claim 23, wherein the first elastic protrusions and the second elastic protrusions are spaced apart from each other at equal distance along the first direction.

25. The display device of claim 24, wherein a width of each of the bump electrodes is N times a sum of the width of each of the elastic protrusions and a distance between two elastic protrusions adjacent in the first direction among the elastic protrusions, where, N is a positive integer.

* * * * *